US012612304B2

(12) United States Patent
Bamsey et al.

(10) Patent No.: US 12,612,304 B2
(45) Date of Patent: Apr. 28, 2026

(54) METHOD FOR MAKING MICRONEEDLES USING A HIGH VISCOSITY COMPOSITION

(71) Applicant: Innoture IP Limited, London (GB)

(72) Inventors: Ryan Bamsey, London (GB); Ionut Cameliu Ichim, London (GB)

(73) Assignee: Innoture IP Limited, London (GB)

( * ) Notice: Subject to any disclaimer, the term of this patent is extended or adjusted under 35 U.S.C. 154(b) by 526 days.

(21) Appl. No.: 17/636,678

(22) PCT Filed: Aug. 20, 2020

(86) PCT No.: PCT/GB2020/052009
§ 371 (c)(1),
(2) Date: Feb. 18, 2022

(87) PCT Pub. No.: WO2021/032993
PCT Pub. Date: Feb. 25, 2021

(65) Prior Publication Data
US 2022/0281741 A1 Sep. 8, 2022

(30) Foreign Application Priority Data

Aug. 20, 2019 (GB) ...................................... 1911910

(51) Int. Cl.
*B81C 1/00* (2006.01)

(52) U.S. Cl.
CPC ..... *B81C 1/00111* (2013.01); *B81B 2201/055* (2013.01)

(58) Field of Classification Search
CPC ............................................ A61M 2037/0053
See application file for complete search history.

(56) References Cited

U.S. PATENT DOCUMENTS

| | | | | |
|---|---|---|---|---|
| 2008/0299290 | A1* | 12/2008 | Kirby ................ | A61M 37/0015 427/2.28 |
| 2011/0240201 | A1* | 10/2011 | Jung ................... | B32B 37/1292 156/60 |
| 2011/0288484 | A1 | 11/2011 | Kendall et al. | |
| 2011/0288485 | A1* | 11/2011 | Tokumoto ............ | A61K 9/0021 604/173 |
| 2014/0066843 | A1* | 3/2014 | Zhang ..................... | A61P 23/02 604/512 |
| 2015/0057604 | A1* | 2/2015 | Arami ............... | A61M 37/0015 29/428 |

(Continued)

FOREIGN PATENT DOCUMENTS

| | | |
|---|---|---|
| EP | 1786580 A1 | 5/2007 |
| EP | 3257549 A1 | 12/2017 |

(Continued)

OTHER PUBLICATIONS

KR20190094065A translation. 2019 (Year: 2019).*

(Continued)

*Primary Examiner* — Cachet I Proctor
(74) *Attorney, Agent, or Firm* — Morgan, Lewis & Bockius LLP

(57) ABSTRACT

The present invention provides a novel method for manufacturing a microstructure via the use of a viscous polymer, particularly microstructures that may be found on medical devices, such as transdermal patches, for either cosmetic or medicinal purposes.

14 Claims, 9 Drawing Sheets

(56)        References Cited

U.S. PATENT DOCUMENTS

| | | | |
|---|---|---|---|
| 2017/0189660 A1 * | 7/2017 | Baek ........................ | B05D 1/00 |
| 2018/0207415 A1 * | 7/2018 | Kim .................. | A61M 37/0015 |
| 2022/0288370 A1 | 9/2022 | Bamsey et al. | |

FOREIGN PATENT DOCUMENTS

| | | | | |
|---|---|---|---|---|
| EP | 3345649 | A1 | | 7/2018 |
| ES | 2357079 | T3 | | 5/2007 |
| JP | 2008509771 | A | | 4/2008 |
| JP | 2009295900 | A | | 12/2009 |
| JP | 5298011 | B2 | | 6/2013 |
| JP | 2013177376 | A | | 9/2013 |
| JP | 2015100659 | A | | 11/2013 |
| JP | 2019-503798 | A | | 2/2019 |
| JP | 2019-34188 | A | | 3/2019 |
| JP | 2019-72534 | A | | 5/2019 |
| KR | 20190094065 | A | * | 8/2019 |
| KR | 1020190094065 | A | | 8/2019 |
| WO | 2006/018642 | A1 | | 2/2006 |
| WO | 2018047800 | A | | 3/2018 |
| WO | 2017200214 | A1 | | 11/2023 |

OTHER PUBLICATIONS

International Search Report and Written Opinion dated Nov. 16, 2020 for International Patent Application No. PCT/GB2020/052009, 12 pages.

English translation of Office Action for related Japanese Patent Application No. 2022-511197 dated Jun. 20, 2024, 7 pages.

Third Office Action issued in corresponding Chinese Patent Application No. 202080058679.3, dated Jan. 20, 2025, 17 pages with English translation.

Search Report issued in corresponding Chinese Patent Application No. 202080058679.3, dated Aug. 20, 2020, 2 pages.

English translation of Japanese Office Action for corresponding Japanese Patent Application No. 2022-511197, dated Apr. 4, 2025, 4 pages.

Notice of Preliminary Rejection issued in corresponding Korean Patent Application No. 10-2022-7009209, dated Aug. 27, 2025, with English translation, 18 pages.

Examination Report issued in corresponding Australian Patent Application No. 2020333230, dated Jul. 21, 2025, 5 pages.

Examination Report issued in corresponding Chilean Patent Application No. 202200207, dated Jul. 1, 2025 20 pages.

\* cited by examiner

S4800 1.0kV 9.5mm x30 SE(M)                    1.00mm

S4800 1.0kV 7.7mm x30 SE(M)                    1.00mm

S4800 1.0kV 7.7mm x35 SE(M)                              1.00mm

METHOD FOR MAKING MICRONEEDLES USING A HIGH VISCOSITY COMPOSITION

CROSS REFERENCE TO RELATED APPLICATIONS

This application is a U.S. National Phase Application of International Application No. PCT/GB2020/052009 filed on Aug. 20, 2020, which claims the benefit of GB Patent Application No. 1911910.6 filed Aug. 20, 2019, each of which is incorporated by reference herein in its entirety.

FIELD OF INVENTION

The present invention relates to a novel method of manufacturing microstructures, particularly microstructures that may be found on medical devices, such as transdermal patches, for either cosmetic or medicinal purposes.

BACKGROUND

Transdermal drug delivery has long been regarded as an important route for the administration of active pharmaceutical ingredients, partly due to the rise in the number of drugs which are unsuitable for oral administration due to extensive processing in the gut and liver or susceptibility to the acidic conditions of the stomach. Additionally, transdermal drug delivery offers an alternative delivery system to more invasive approaches and gives the patient a higher degree of freedom compared to methods requiring the presence of a medical professional to administer such therapies, such as parenteral administration. While it is possible to transdermally administer certain drugs, for example by applying a gel or coated patch to the skin, the outermost layer of the skin, a barrier of 10-20 μm termed the stratum corneum, which evolved to prevent the unwanted entry of microorganisms and toxic substances, also prevents, or at least significantly reduces, the entry of most pharmaceutical compounds.

As a result, a number of methods have been devised to aid delivery of pharmaceutical compounds across the stratum corneum. One means is the use of patches comprising microstructures, specifically microneedles, which are capable of achieving the aforementioned. Due to their size, microneedles have the added advantage over conventional hypodermic needles in that they may only penetrate the epidermis, and potentially not come into contact with sensory neurones located deeper in the skin. Microneedles may reduce or avoid the pain and compliance issues often associated with injections. Previous transdermal patches have been manufactured using various metals and hard plastics, however these patches lack the flexibility required to adapt to different areas of the body and cannot sustain the addition of large numbers of microstructures across a large surface area.

The inventors have previously described an improved method for producing microstructures, in particular microneedles (outlined in EP1786580 and U.S. Pat. No. 8,192,787), wherein existing polymer and microprocessor technologies have been adapted to produce a superior method of lithographic deposition of polymers. This method uses a 'layering technique', involving the use of templates and squeegee blades, in which different microstructure designs can be created. For example, various needle sizes and shapes can be produced, the final product of which is suitable for various flexible substrates over large surface areas. Flexibility is important when designing transdermal patches, for example, which need to be able to flexibly adapt to the contours of the human body.

The present invention provides a means to improve and expand the uses of these known patches containing microstructures by providing a novel and surprisingly advantageous method of manufacturing the microstructures. This novel manufacturing method enables a more efficient and accurate process of producing microstructures. The present invention is useful for manufacturing microstructures on any substrate, not just limited to transdermal patches.

Previous methods of manufacturing microstructures have used microstructure compositions of 2000 centipoise (cps) or 2 pascal-seconds (Pa·s) in its pre-cured state. The viscosity of these microstructure compositions are known to create a number of issues that the current inventors have endeavored to overcome. Firstly, the use of microstructure compositions with this viscosity allows for no flexibility in the size of the through-hole of the template to be used, for example, the changing shape of the microstructure (pointed needle shape) requires a variety of different sized through-holes and accordingly, a range of viscosities of the microstructure composition to create an accurate and reproducible microstructure. Secondly, microstructure compositions with this viscosity are prone to becoming aerated due to the rolling mechanism of the squeegee blade. Introducing air pockets into the composition causes deformities in the microstructure. Thirdly, current microstructure compositions have a tendency to travel up the squeegee blade away from the surface of the template and the substrate. This leads to a waste of precious material. Finally, previously used microstructure compositions tend to deposit in low amounts. This necessitates multiple passes to build effective height microstructures, costing time and money.

The inventors have identified a novel method of manufacturing microstructures that has a high speed of operation, high accuracy, high reproducibility and the scalability for industrial manufacture that previously used methods were unable to achieve.

The listing or discussion of an apparently prior-published document in this specification should not necessarily be taken as an acknowledgment that the document is part of the state of the art or is common general knowledge.

SUMMARY OF INVENTION

The present invention is based on the surprising discovery by the inventors that the manufacture of a microstructure using a microstructure composition having a viscosity of at least 10,000 cps or at least 10 Pa·s, results in a more time efficient and accurate process compared to a microstructure composition with a viscosity value less than that already known in the art.

Accordingly, the present invention provides for a method comprising the step of applying a microstructure composition to a perforated template comprising through-holes, wherein the microstructure composition passes through a through-hole and is deposited on a substrate, thereby forming a microstructure, characterised in that the microstructure composition has a viscosity of at least 10,000 cps or at least 10 Pa·s.

The method may further comprise the step of exposing the microstructure composition deposited on the substrate to a curing agent, preferably wherein the curing agent is ultraviolet (UV) light, and may comprise one or more further steps comprising repeating the application of the microstructure composition, optionally wherein the perforated template is moved away from the substrate and re-positioned and aligned, such that the through-hole aligns with the microstructure, between each application of the microstructure composition.

The invention also provides a transdermal patch comprising microstructures manufactured using the methods of the invention. The invention also provides a kit comprising a transdermal patch according to the invention and instructions for use of the patch.

The present invention further provides for a therapeutic or cosmetic method of treating a condition in a patient in need thereof comprising applying the transdermal patch herein described to an exposed surface on a subject.

The present invention further provides for a microstructure obtainable by the method herein disclosed.

The invention will now be described in more detail with reference to the following figures and examples.

DETAILED DESCRIPTION

Figure 1:
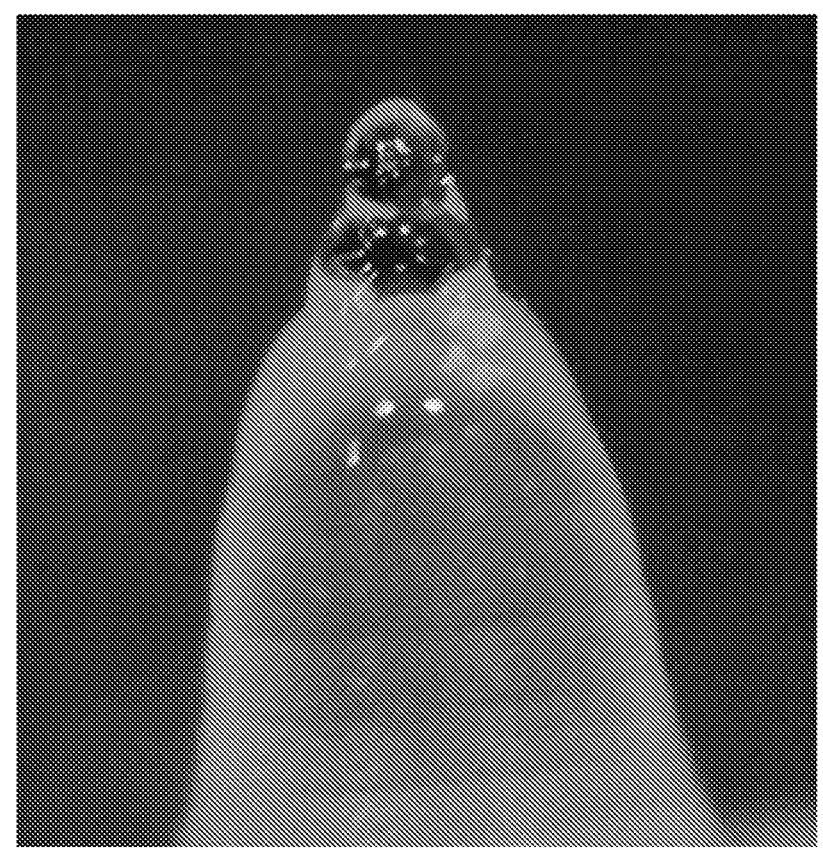
FIG. 1: An example micrograph displaying the use of a less viscous polymer (tip) using a template with a through-hole with a cross-sectional width of 100 μm, in combination with a higher viscosity polymer (base) using a template with a through-hole with a cross-sectional width of 200 μm.

The following description is presented to enable any person skilled in the art to make and use the invention. Various modifications to the disclosed embodiments will be readily apparent to those skilled in the art.

The present invention provides a novel method by which microstructures may be accurately and efficiently manufactured via the use of a microstructure composition which has a viscosity of at least 10,000 cps or 10 Pa·s. A microstructure composition with a viscosity of at least the aforementioned value has a number of advantages compared to microstructure compositions which have a viscosity value of below 10,000 cps or 10 Pa·s. Firstly, microstructure compositions above this value may be varied according to the through-hole dimensions of the perforated template to create the microstructure in a more efficient manner than microstructure compositions below this value. Secondly, microstructure compositions of above this viscosity value have a reduced tendency to become aerated, in some cases not becoming aerated at all, due to the rolling mechanism of the squeegee blade (used to direct the microstructure composition through the through-holes of the perforated template and onto the substrate). Thirdly, when the print cycle is commenced, it is not uncommon for the microstructure composition to travel up the squeegee blade away from the substrate. To overcome this, an excess of microstructure composition is required, resulting in wasted resource of precious material. Microstructure compositions of at least 10,000 cps or 10 Pa·s prevent this from occurring, resulting in a more efficient and cost effective process. Finally, microstructure compositions of above this viscosity value result in a higher deposit amount, requiring less passes to build the height of the microstructure. The present invention solves the above problems associated with already known methods in this area.

In order to place the present invention in the appropriate context, and provide familiarisation with the terms used throughout this application, we have provided a brief overview of the previously used method for manufacturing microstructures, according to EP1786580 and U.S. Pat. No. 8,192,787. The present invention provides significant advantages over this method. Briefly, the substrate to which the desired microstructure composition is to be deposited is aligned with a 'perforated template' or 'stencil' containing numerous 'apertures' or 'through-holes' using the appropriate technology. The microstructure composition is applied to the 'perforated template' or 'stencil' and subsequently urged through the 'through-holes' or 'apertures' and the desired amount of the microstructure composition is deposited onto the receiving substrate. The amount of microstructure composition that is deposited onto the receiving substrate on each pass is referred to as the 'deposit yield'. To urge the microstructure composition through the 'perforated template' or 'stencil', a squeegee blade, or equivalent, is used to direct the microstructure composition to the desired position by applying pressure to the template. The above terms will be used throughout the following description of the present invention. Two methods of printing may be employed; 1) non-contact printing, where the template is not in contact with the substrate and 2) contact printing, where the template is in contact with the substrate.

Accordingly, in a first aspect the present invention provides for a method comprising the step of applying a microstructure composition to a perforated template comprising through-holes, wherein the microstructure composition passes through a through-hole and is deposited on a substrate, thereby forming a microstructure, characterised in that the microstructure composition has a viscosity of at least 10,000 cps or 10 Pa·s.

By the term 'viscosity', we intend a quantity expressing the magnitude of internal friction in a fluid. The viscosity of the microstructure composition of the present invention can be measured using a rotational viscometer. The skilled person will recognise that rotational viscometers measure the viscosity of the sample by turning a spindle in a cup, with the viscosity being determined through the measurement of the torque on a vertical shaft that rotates a spindle. Two different set-ups may be used for this purpose; a spring type instrument or a servo motor instrument. Alternatively, any other suitable method for determining the viscosity of the microstructure composition may be employed.

It is envisaged that the method for manufacturing a microstructure composition according to the invention may further comprise the step of exposing the microstructure composition deposited on the substrate to a curing agent. The term 'curing agent' in the context of the present invention refers to an agent that is capable of facilitating the bonding of the molecular components of the microstructure composition in order to produce a hardened end product. In an embodiment, it is envisaged that the curing agent may be ultraviolet (UV) light.

Yet further, the method for manufacturing a microstructure according to the invention may further comprise one or more further steps comprising repeating the application of the microstructure composition, optionally wherein the perforated template is moved away from the substrate and re-positioned and aligned, such that the through-hole aligns with the microstructure, between each application of the microstructure composition. In an embodiment, it is envisaged that the template may be re-positioned using an alignment system of positional markings incorporated on the surface of the perforated template, and corresponding markers incorporated on the substrate onto which the microstructure composition is deposited. Using an alignment system of positional markings ensures that the perforated template can be re-positioned in an accurate manner relative to the portion of the microstructure already manufactured. A number of alignment systems may be suitable for this purpose, one such system is the DEK Hawkeye system.

The term 'microstructure' is intended to include any structure between 10 μm and 10 mm in height. For example, between 10 μm and 100 μm in height, between 10 μm and 500 μm in height, between 10 μm and 1000 μm in height, between 10 μm and 5000 μm in height, between 50 μm and 100 μm in height, between 50 μm and 500 μm in height, between 50 μm and 1000 μm in height, between 50 μm and 5000 μm in height, between 100 μm and 500 μm in height, between 100 μm and 1000 μm in height, between 100 μm and 5000 μm in height, between 500 μm and 1000 μm in height or between 500 μm and 5000 μm in height. Within the context of the present invention, the term 'microstructure' predominantly refers to structures located on transdermal patches. The microstructures may be microneedles and/or may take on various shapes or forms such as extended wires or doughnut shapes, for example.

By 'through-hole' we intend an opening that extends completely through the material of an object, producing a continuous channel from one side of the object to the other.

It is envisaged that the microstructure composition may have a viscosity of 10,000 cps to 250,000 cps. For example, 10,000 cps to 20,000 cps, 10,000 cps to 30,000 cps, 10,000 cps to 40,000 cps, 10,000 cps to 50,000 cps, 10,000 cps to 60,000 cps, 10,000 cps to 70,000 cps, 10,000 cps to 80,000 cps, 10,000 cps to 90,000 cps, 10,000 cps to 100,000 cps, 10,000 cps to 110,000 cps, 10,000 cps to 120,000 cps, 10,000 cps to 130,000 cps, 10,000 cps to 140,000 cps, 10,000 cps to 150,000 cps, 10,000 cps to 160,000 cps, 10,000 cps to 170,000 cps, 10,000 cps to 180,000 cps, 10,000 cps to 190,000 cps, 10,000 cps to 200,000 cps, 10,000 cps to 210,000 cps, 10,000 cps to 220,000 cps, 10,000 cps to 230,000 cps, 10,000 cps to 240,000 cps or 10,000 cps to 250,000 cps, 20,000 cps to 30,000 cps, 20,000 cps to 40,000 cps, 20,000 cps to 50,000 cps, 20,000 cps to 60,000 cps, 20,000 cps to 70,000 cps, 20,000 cps to 80,000 cps, 20,000 cps to 90,000 cps, 20,000 cps to 100,000 cps, 20,000 cps to 110,000 cps, 20,000 cps to 120,000 cps, 20,000 cps to 130,000 cps, 20,000 cps to 140,000 cps, 20,000 cps to 150,000 cps, 20,000 cps to 160,000 cps, 20,000 cps to 170,000 cps, 20,000 cps to 180,000 cps, 20,000 cps to 190,000 cps, 20,000 cps to 200,000 cps, 20,000 cps to 210,000 cps, 20,000 cps to 220,000 cps, 20,000 cps to 230,000 cps, 20,000 cps to 240,000 cps or 20,000 cps to 250,000 cps, 30,000 cps to 40,000 cps, 30,000 cps to 50,000 cps, 30,000 cps to 60,000 cps, 30,000 cps to 70,000 cps, 30,000 cps to 80,000 cps, 30,000 cps to 90,000 cps, 30,000 cps to 100,000 cps, 30,000 cps to 110,000 cps, 30,000 cps to 120,000 cps, 30,000 cps to 130,000 cps, 30,000 cps to 140,000 cps, 30,000 cps to 150,000 cps, 30,000 cps to 160,000 cps, 30,000 cps to 170,000 cps, 30,000 cps to 180,000 cps, 30,000 cps to 190,000 cps, 30,000 cps to 200,000 cps, 30,000 cps to 210,000 cps, 30,000 cps to 220,000 cps, 30,000 cps to 230,000 cps, 30,000 cps to 240,000 cps or 30,000 cps to 250,000 cps, 40,000 cps to 50,000 cps, 40,000 cps to 60,000 cps, 40,000 cps to 70,000 cps, 40,000 cps to 80,000 cps, 40,000 cps to 90,000 cps, 40,000 cps to 100,000 cps, 40,000 cps to 110,000 cps, 40,000 cps to 120,000 cps, 40,000 cps to 130,000 cps, 40,000 cps to 140,000 cps, 40,000 cps to 150,000 cps, 40,000 cps to 160,000 cps, 40,000 cps to 170,000 cps, 40,000 cps to 180,000 cps, 40,000 cps to 190,000 cps, 40,000 cps to 200,000 cps, 40,000 cps to 210,000 cps, 40,000 cps to 220,000 cps, 40,000 cps to 230,000 cps, 40,000 cps to 240,000 cps or 40,000 cps to 250,000 cps, 50,000 cps to 60,000 cps, 50,000 cps to 70,000 cps, 50,000 cps to 80,000 cps, 50,000 cps to 90,000 cps, 50,000 cps to 100,000 cps, 50,000 cps to 110,000 cps, 50,000 cps to 120,000 cps, 50,000 cps to 130,000 cps, 50,000 cps to 140,000 cps, 50,000 cps to 150,000 cps, 50,000 cps to 160,000 cps, 50,000 cps to 170,000 cps, 50,000 cps to 180,000 cps, 50,000 cps to 190,000 cps, 50,000 cps to 200,000 cps, 50,000 cps to 210,000 cps, 50,000 cps to 220,000 cps, 50,000 cps to 230,000 cps, 50,000 cps to 240,000 cps or 50,000 cps to 250,000 cps, 60,000 cps to 70,000 cps, 60,000 cps to 80,000 cps, 60,000 cps to 90,000 cps, 60,000 cps to 100,000 cps, 60,000 cps to 110,000 cps, 60,000 cps to 120,000 cps, 60,000 cps to 130,000 cps, 60,000 cps to 140,000 cps, 60,000 cps to 150,000 cps, 60,000 cps to 160,000 cps, 60,000 cps to 170,000 cps, 60,000 cps to 180,000 cps, 60,000 cps to 190,000 cps, 60,000 cps to 200,000 cps, 60,000 cps to 210,000 cps, 60,000 cps to 220,000 cps, 60,000 cps to 230,000 cps, 60,000 cps to 240,000 cps or 60,000 cps to 250,000 cps, 70,000 cps to 80,000 cps, 70,000 cps to 90,000 cps, 70,000 cps to 100,000 cps, 70,000 cps to 110,000 cps, 70,000 cps to 120,000 cps, 70,000 cps to 130,000 cps, 70,000 cps to 140,000 cps, 70,000 cps to 150,000 cps, 70,000 cps to 160,000 cps, 70,000 cps to 170,000 cps, 70,000 cps to 180,000 cps, 70,000 cps to 190,000 cps, 70,000 cps to 200,000 cps, 70,000 cps to 210,000 cps, 70,000 cps to 220,000 cps, 70,000 cps to 230,000 cps, 70,000 cps to 240,000 cps or 70,000 cps to 250,000 cps, 80,000 cps to 90,000 cps, 80,000 cps to 100,000 cps, 80,000 cps to 110,000 cps, 80,000 cps to 120,000 cps, 80,000 cps to 130,000 cps, 80,000 cps to 140,000 cps, 80,000 cps to 150,000 cps, 80,000 cps to 160,000 cps, 80,000 cps to 170,000 cps, 80,000 cps to 180,000 cps, 80,000 cps to 190,000 cps, 80,000 cps to 200,000 cps, 80,000 cps to 210,000 cps, 80,000 cps to 220,000 cps, 80,000 cps to 230,000 cps, 80,000 cps to 240,000 cps or 80,000 cps to 250,000 cps, 90,000 cps to 100,000 cps, 90,000 cps to 110,000 cps, 90,000 cps to 120,000 cps, 90,000 cps to 130,000 cps, 90,000 cps to 140,000 cps, 90,000 cps to 150,000 cps, 90,000 cps to 160,000 cps, 90,000 cps to 170,000 cps, 90,000 cps to 180,000 cps, 90,000 cps to 190,000 cps, 90,000 cps to 200,000 cps, 90,000 cps to 210,000 cps, 90,000 cps to 220,000 cps, 90,000 cps to 230,000 cps, 90,000 cps to 240,000 cps or 90,000 cps to 250,000 cps, 100,000 cps to 110,000 cps, 100,000 cps to 120,000 cps, 100,000 cps to 130,000 cps, 100,000 cps to 140,000 cps, 100,000 cps to 150,000 cps, 100,000 cps to 160,000 cps, 100,000 cps to 170,000 cps, 100,000 cps to 180,000 cps, 100,000 cps to 190,000 cps, 100,000 cps to 200,000 cps, 100,000 cps to 210,000 cps, 100,000 cps to 220,000 cps, 100,000 cps to 230,000 cps, 100,000 cps to 240,000 cps or 100,000 cps to 250,000 cps, 110,000 cps to 120,000 cps, 110,000 cps to 130,000 cps, 110,000 cps to 140,000 cps, 110,000 cps to 150,000 cps, 110,000 cps to 160,000 cps, 101,000 cps to 170,000 cps, 110,000 cps to 180,000 cps, 110,000 cps to 190,000 cps, 110,000 cps to 200,000 cps, 110,000 cps to 210,000 cps, 110,000 cps to 220,000 cps, 110,000 cps to 230,000 cps, 110,000 cps to 240,000 cps or 110,000 cps to 250,000 cps, 120,000 cps to 130,000 cps, 120,000 cps to 140,000 cps, 120,000 cps to 150,000 cps, 120,000 cps to 160,000 cps, 120,000 cps to 170,000 cps, 120,000 cps to 180,000 cps, 120,000 cps to 190,000 cps, 120,000 cps to 200,000 cps, 120,000 cps to 210,000 cps, 120,000 cps to 220,000 cps, 120,000 cps to 230,000 cps, 120,000 cps to 240,000 cps or 120,000 cps to 250,000 cps, 130,000 cps to 140,000 cps, 130,000 cps to 150,000 cps, 130,000 cps to 160,000 cps, 130,000 cps to 170,000 cps, 130,000 cps to 180,000 cps, 130,000 cps to 190,000 cps, 130,000 cps to 200,000 cps, 130,000 cps to 210,000 cps, 130,000 cps to 220,000 cps, 130,000 cps to 230,000 cps, 130,000 cps to 240,000 cps or 130,000 cps to 250,000 cps, 140,000 cps to 150,000 cps, 140,000 cps to 160,000 cps, 140,000 cps to 170,000 cps, 140,000 cps to 180,000 cps, 140,000 cps to 190,000 cps, 140,000 cps to 200,000 cps, 140,000 cps to 210,000 cps, 140,000 cps to 220,000 cps, 140,000 cps to 230,000 cps, 140,000 cps to 240,000 cps or 140,000 cps to 250,000 cps, 150,000 cps to 160,000 cps, 150,000 cps to 170,000 cps, 150,000 cps to 180,000 cps, 150,000 cps to 190,000 cps, 150,000 cps to 200,000 cps, 150,000 cps to 210,000 cps, 150,000 cps to 220,000 cps, 150,000 cps to 230,000 cps, 150,000 cps to 240,000 cps or 150,000 cps to 250,000 cps, 160,000 cps to 170,000 cps, 160,000 cps to 180,000 cps, 160,000 cps to 190,000 cps, 160,000 cps to 200,000 cps, 160,000 cps to 210,000 cps, 160,000 cps to 220,000 cps, 160,000 cps to 230,000 cps, 160,000 cps to 240,000 cps or 160,000 cps to 250,000 cps, 170,000 cps to 180,000 cps, 170,000 cps to 190,000 cps, 170,000 cps to 200,000 cps, 170,000 cps to 210,000 cps, 170,000 cps to 220,000 cps, 170,000 cps to 230,000 cps, 170,000 cps to 240,000 cps or 170,000 cps to 250,000 cps, 180,000 cps to 190,000 cps, 180,000 cps to 200,000 cps, 180,000 cps to 210,000 cps, 180,000 cps to 220,000 cps, 180,000 cps to 230,000 cps, 180,000 cps to 240,000 cps or 180,000 cps to 250,000 cps, 190,000 cps to 200,000 cps, 190,000 cps to 210,000 cps, 190,000 cps to 220,000 cps, 190,000 cps to 230,000 cps, 190,000 cps to 240,000 cps or 190,000 cps to 250,000 cps, 200,000 cps to 210,000 cps, 200,000 cps to 220,000 cps, 200,000 cps to 230,000 cps, 200,000 cps to 240,000 cps or 200,000 cps to 250,000 cps, 210,000 cps to 220,000 cps, 210,000 cps to 230,000 cps, 210,000 cps to 240,000 cps or 210,000 cps to 250,000 cps, 220,000 cps to 230,000 cps, 220,000 cps to 240,000 cps or 220,000 cps to 250,000 cps, 230,000 cps to 240,000 cps or 230,000 cps to 250,000 cps, 240,000 cps to 250,000 cps, or any intervening range using the preceding as endpoints. The equivalent viscosity value in Pa·s, for example 10 Pa·s to 250 Pa·s, is taken to also be included in the present invention disclosed herein. The viscosity chosen within this range may be dependent on the size of the through-hole of the perforated template, for example, a smaller through-hole may require a less viscous composition, whereas a larger through-hole may benefit from or require a more viscous composition. The selection of viscosity may be a balance between the size of the through-hole of the perforated template and the number of print cycles to enable an efficient process.

The amount of microstructure composition deposited on the substrate may be dependent on a number of factors; the thickness of the perforated template, the material the perforated template is made from, the dimensions of the through-holes and the physical properties of the composition. According to the invention the use of more viscous polymers (>10,000 cps or >10 Pa·s) will reduce the number of repetitions of the method herein disclosed to create the microstructure, resulting in a more energy and cost efficient process.

It is envisaged that the microstructure composition may comprise a polymer. In an embodiment the microstructure polymer may be a UV-curable polymer, such that UV light is used to generate a crosslinked network of polymers. In yet a further embodiment, the UV-curable polymers may be acrylate and/or methacrylate. However, a skilled person will recognise that any UV-curable polymer with the desired properties, for example, a polymer which can be rapidly cured (for example, within 1 to 5 seconds), would be appropriate for this purpose.

It is envisaged that the microstructure composition may be self-adherent. The term 'self-adherent' is intended to refer to the ability of the microstructure composition to stick to itself without an additional element being introduced. This property enables a deposit of microstructure composition to be added to a preceding deposit, with each subsequent deposit adhering to the previous one without the need for any additional components. The microstructure composition deposit may be the same or distinct from subsequent or preceding deposits, for example, in terms of viscosity, from the preceding deposit, as long as it is adherent. The manufacturing process is therefore more streamlined, resulting in a more time and cost efficient process. Polymers that have a viscosity above 10,000 cps and increasing to over 30,000 cps demonstrate higher deposit yields, removing the need for subsequent deposits to reach a desired height of the microstructure. The resulting microstructure characteristics can be manipulated by using polymers of different viscosities in tandem with template physical parameters to generate unique structures in an efficient way. Additionally, the use of combinations of different polymer viscosities in building the microstructures through subsequent deposits can also generate unique structural characteristics.

It is envisaged that the microstructure composition may be substantially circular, square, rectangular, hexagonal, triangular or of a kidney bean shape. The shape of the microstructure used may be linked to the indication being treated. For example, some shapes may result in a larger surface area being covered compared to others. The shape of the microstructure or the array of microstructures may also be dependent on the body part to which it is intended to be applied.

The microstructure may be one of an array of microstructures to be manufactured using the present invention herein described. By 'array' we intend multiple microstructures present on a single solid substrate which display a specific arrangement relative to each other. For example, an array of microstructures may be a transdermal patch with a plurality of microstructures and positioned in a uniform manner across the supporting solid substrate. A skilled person in the art will recognise that different patterns of microstructures may be utilised to enhance delivery of the desired compound depending on the body part to be treated.

It is envisaged that the microstructure disclosed herein may be a microneedle. By 'microneedle' we intend a sub-1 mm protrusion that will disrupt the stratum corneum. The presently disclosed method may also be applicable to a variety of different microstructures that would benefit from a novel technique in which accuracy, precision and scalability can all be achieved in an adequate time frame. Examples of microstructure shapes to which this method of manufacture could be applied to may include doughnut shapes and extended wires. It is particularly envisaged that this method may be applied in the electrical and diagnostic fields where typically the components of such products are on a particularly small scale.

The substrate to which the microstructure composition is deposited may be a flat smooth substrate, a rough substrate or an absorbent substrate. Examples of each of the aforementioned substrates may be Melinex plastic, polyurethane foam or a "melt weave type", respectively. The inventors of the present invention have surprisingly found that using a microstructure composition having a viscosity of at least 10,000 cps (10 Pa·s) results in microstructures having desirable characteristics across all types of substrate used.

It is envisaged that the substrate may be polyvinyl chloride (PVC) substrate, a metal substrate, a poly-lactic acid substrate, a glass substrate, a ceramic substrate, a polystyrene substrate, a cellulose based substrate, a poly-vinyl alcohol substrate, a polycarbonate substrate, a poly-methyl methacrylate substrate, a silicone substrate, a poly-ethylene terephthalate substrate, a polyurethane substrate or a nitrocellulose substrate. It is understood that the substrate may be formed from any material suitable for contact with human, or non-human, exterior surfaces and displaying the desired properties, for example, flexibility and durability. Examples of such exterior surfaces include skin, mucous membranes, the oral cavity or eyes of the subject. In an embodiment the substrate may form at least a part of a transdermal patch.

It is envisaged that the microstructure composition may further comprise an active ingredient, an electrically conductive material and/or a bio-chemical reagent.

The term 'active ingredient' is taken to include active ingredients of both a pharmaceutical and non-pharmaceutical nature. Non-pharmaceutical active ingredients may be used, for example, in the cosmetic industry. Examples of active ingredients which are non-pharmaceutical in nature include alpha-hydroxy acids, beta-hydroxy acid, hydroquinone, kojic acid, retinol, L-ascorbic acid, hyaluronic acid, copper peptide, alpha-lipoic acid and dimethylaminoethanol. The presence of an electrically conductive material may aid the movement of active ingredients across the stratum corneum. In this instance, an externally placed electrode would be required to deliver physiologically acceptable electrical currents (0.1-1 mA/per cm$^2$). Examples of such an electrically conductive material may be the addition of conductive polymers to the microstructure composition; organic polymers that are known to conduct electricity. Conductive polymers may include polyacetylene, polypyrrole, polyindole and polyaniline to highlight a few. It is understood that any electrically conductive material appropriate for contact with the human body, or other mammalian body, may be appropriate for inclusion in the microstructure composition. By the term 'bio-chemical reagent' we intend any biological material or organic compound that can be found in a biological system, or that can be used for biological research. For example, the microstructure composition may comprise nucleotides and/or amino acids intended for therapeutic or cosmetic use, for example, enhancing collagen production. The inclusion of a bio-chemical reagent may also aid in diagnostic processes.

It is envisaged that the inclusion of such additional materials within the microstructure composition may be particularly relevant for instances whereby the microstructure itself detaches from the substrate (either by breaking away or by disintegrating).

Additionally, it is envisaged that the method of manufacturing the microstructure may comprise a further step of applying a coating composition to the microstructure, wherein the coating composition comprises an active ingredient, an electrically conductive material and/or a biochemical reagent. The application of a coating composition to the microstructure may also be utilised as a structural protective barrier over the microstructure.

The coating composition may be dissolvable, allowing for the release of the active ingredient at the desired time. The active ingredient may be released from the coating composition either by the coating itself dissolving or via a diffusion gradient. The coating may be triggered to dissolve by using a primer to provide a sticky surface which may be engineered to dissolve and release the active ingredient on contact with water in the skin or via a temperature change, for example, its melting point. In some instances, a primer step may not be required. The active ingredient within the coating composition may be delivered at either the surface of the skin or delivered much deeper into the dermis. The extent of delivery will be dependent on the length of the microstructure and the indication to be treated. An active ingredient within the context of the present invention refers to the element of the coating composition which is biologically active and thus produces the desired therapeutic effect.

If the active ingredient is an active pharmaceutical ingredient, the active pharmaceutical ingredient may be a biologically active skin regenerative compound, preferably wherein the skin regenerative compound is hyaluronic acid, vitamin B, vitamin C, co-enzyme Q10, matrixyl or resveratrol. It is intended that these skin regenerative compounds may be utilised to manufacture cosmetic products comprising microstructures coated using the methods described herein. Such products may be used to treat aesthetic problems for patients. Such conditions to be treated may include lateral canthal rhytids (crow-feet), perioral dermatitis, tear trough deformity, décolletage wrinkles (chest wrinkles) and age spots. Additionally, skin regenerative compounds may include compounds aimed at improving the appearance of scarring or to encourage the speed of wound healing. A person skilled in the art will recognise that the compound to be included in the coating composition will depend on the condition to be treated. For example, hyaluronic acid may be a more suitable compound to use for lateral canthal rhytids than vitamin B or C. Additionally, the coating composition may comprise just a single skin regenerative compound or may include a combination of compounds, where two or more different compounds are present within the same coating composition. The latter may be particularly useful if treating patients with multiple conditions to be addressed.

Further, the active pharmaceutical ingredient may be an analgesic, an anti-inflammatory and/or an immunosuppressant compound, preferably wherein the compound is diclofenac, ibuprofen, lidocaine or hydrocortisone. An analgesic is taken to be a compound whose primary action is to relieve pain in a subject. An anti-inflammatory compound is taken to be a compound that can relieve inflammation associated with a particular injury or condition. An immunosuppressant compound is taken to be a compound that inhibits or prevents the activity of the immune system. It is intended that the above compounds may be suitable for use as a method of pain control, whether it is used as general pain relief or as a local anaesthetic, or for dermatological conditions such as psoriasis or eczema. A person skilled in the art would recognise that the above listed compounds may fall into more than one of the above groups. For example, ibuprofen is recognised to be both an analgesic and an anti-inflammatory. It is understood that the compound to be included in the coating composition will depend on the condition to be treated. For example, hydrocortisone will be more suitable for treating eczema than ibuprofen. Additionally, the coating composition may comprise just a single analgesic, anti-inflammatory or immunosuppressant compound or may include a combination of compounds, where two or more different compounds are present within the same coating composition. The latter may be particularly useful if treating patients with multiple conditions to be addressed.

The active ingredient may be released over a timescale of seconds to hours. The coating compositions may be tailored to have various release times according to the end application, for example, either an acute or chronic condition to be treated.

In addition to the relevant active ingredient for the condition in question, the coating composition may further comprise compounds suitable for use in a pharmaceutical formulation. Such compounds may include acceptable pharmaceutical carriers, examples of which include encapsulation vehicles, nano-particles, micelles, skin penetration enhancers and other excipients.

Additionally, the coating composition may form a structural protective barrier over the microstructure. This may help protect a more fragile microstructure from breaking as it moves through the outer most layer of the skin; the stratum corneum. The protective barrier may cover the entirety of the microstructure or just part of the microstructure, for example, the tip as the most delicate part. A structural protective barrier coating may require at least a single coating. The structural protective barrier formed by the coating composition may be triggered to dissolve by the exposure of the coating composition to a gas or a liquid, such as a solvent, for example, an alcohol in liquid or vapour phase, resulting in the exposure of the microstructure.

The method of the present invention may be further characterised in that if the cross-sectional width of the through-hole is less than 100 µm, the microstructure composition has a viscosity of at least 2100 cps and if the cross-sectional width of the through-hole is more than 100 µm, the microstructure composition has a viscosity of at least 10,000 cps. For example, if the cross-sectional width of the through-hole is less than 100 µm, the microstructure composition may have a viscosity of 2100 cps to 9999 cps, 2200 cps to 9999 cps, 2300 cps to 9999 cps, 2400 cps to 9999 cps, 2500 cps to 9999 cps, 2600 cps to 9999 cps, 2700 cps to 9999 cps, 2800 cps to 9999 cps, 2900 cps to 9999 cps, 3000 cps to 9999 cps, 3100 cps to 9999 cps, 3200 cps to 9999 cps, 3300 cps to 9999 cps, 3400 cps to 9999 cps, 3500 cps to 9999 cps, 3600 cps to 9999 cps, 3700 cps to 9999 cps, 3800 cps to 9999 cps, 3900 cps to 9999 cps, 4000 cps to 9999 cps, 4100 cps to 9999 cps, 4200 cps to 9999 cps, 4300 cps to 9999 cps, 4400 cps to 9999 cps, 4500 cps to 9999 cps, 4600 cps to 9999 cps, 4700 cps to 9999 cps, 4800 cps to 9999 cps, 4900 cps to 9999 cps, 5000 cps to 9999 cps, 5100 cps to 9999 cps, 5200 cps to 9999 cps, 5300 cps to 9999 cps, 5400 cps to 9999 cps, 5500 cps to 9999 cps, 5600 cps to 9999 cps, 5700 cps to 9999 cps, 5800 cps to 9999 cps, 5900 cps to 9999 cps, 6000 cps to 9999 cps, 6100 cps to 9999 cps, 6200 cps to 9999 cps, 6300 cps to 9999 cps, 6400 cps to 9999 cps, 6500 cps to 9999 cps, 6600 cps to 9999 cps, 6700 cps to 9999 cps, 6800 cps to 9999 cps, 6900 cps to 9999 cps, 7000 cps to 9999 cps, 7100 cps to 9999 cps, 7200 cps to 9999 cps, 7300 cps to 9999 cps, 7400 cps to 9999 cps, 7500 cps to 9999 cps, 7600 cps to 9999 cps, 7700 cps to 9999 cps, 7800 cps to 9999 cps, 7900 cps to 9999 cps, 8000 cps to 9999 cps, 8100 cps to 9999 cps, 8200 cps to 9999 cps, 8300 cps to 9999 cps, 8400 cps to 9999 cps, 8500 cps to 9999 cps, 8600 cps to 9999 cps, 8700 cps to 9999 cps, 8800 cps to 9999 cps, 8900 cps to 9999 cps, 9000 cps to 9999 cps, 9100 cps to 9999 cps, 9200 cps to 9999 cps, 9300 cps to 9999 cps, 9400 cps to 9999 cps, 9500 cps to 9999 cps, 9600 cps to 9999 cps, 9700 cps to 9999 cps, 9800 cps to 9999 cps or 9900 cps to 9999 cps. For example, if the cross-sectional width of the through-hole is more than 100 µm, the microstructure composition may have a viscosity of 10,000 cps to 20,000 cps, 10,000 cps to 30,000 cps, 10,000 cps to 40,000 cps, 10,000 cps to 50,000 cps, 10,000 cps to 60,000 cps, 10,000 cps to 70,000 cps, 10,000 cps to 80,000 cps, 10,000 cps to 90,000 cps, 10,000 cps to 100,000 cps, 10,000 cps to 110,000 cps, 10,000 cps to 120,000 cps, 10,000 cps to 130,000 cps, 10,000 cps to 140,000 cps, 10,000 cps to 150,000 cps, 10,000 cps to 160,000 cps, 10,000 cps to 170,000 cps, 10,000 cps to 180,000 cps, 10,000 cps to 190,000 cps, 10,000 cps to 200,000 cps, 10,000 cps to 210,000 cps, 10,000 cps to 220,000 cps, 10,000 cps to 230,000 cps, 10,000 cps to 240,000 cps or 10,000 cps to 250,000 cps. This variability in viscosity in relation to the width (and depth) of the through hole allows for the creation of different shaped microstructures with high accuracy and efficiency. For example, the cross-sectional width of the through-hole may be consistent from the base of the microstructure to the tip of the microstructure, therefore creating a 'blunt' microstructure. Alternatively, the cross-sectional width of the through-hole may vary from the base of the microstructure to the tip of the microstructure, for example, creating a microstructure with a sharpened point. Varying the viscosity of microstructure composition according to the width of the through-hole of the template, for example the use of a less viscous polymer when the through-hole is smaller, also allows for less wastage of resources due to less of the microstructure composition getting stuck in the through-hole of the template.

Accordingly, in a second aspect, the present invention provides for a transdermal patch comprising the microstructure(s) manufactured by the method herein defined. It is expected that the patch will of course comprise multiple microstructures arranged as appropriate for the intended application of the patch. It is envisaged that the transdermal patch comprising one or more microstructures may aid in the delivery of an active substance to a subject or be used in the diagnosis of a condition, for example, a bacterial or viral infection. It is further envisaged that the transdermal patch herein described may be used as a device for monitoring the success of a variety of treatments, for example, chemotherapy or antibiotic success rates.

The present invention may also provide a kit comprising the transdermal patch herein described and instructions for use of the transdermal patch. The instructions may indicate how long the patch should be applied and in what matter and/or how often the patch, or multiple patches, should be re-applied as appropriate. The kit could accommodate patches with different dosage or different active pharmaceutical ingredients to be applied as instructed by a physician.

The present invention may also provide for a therapeutic or cosmetic method of treating a condition in a patient in need thereof comprising applying the transdermal patch herein described to the subject's skin.

It is envisaged that patches manufactured and coated using the method provided herein and patches provided herein may be useful in treating conditions such as lateral canthal rhytids (crow-feet), perioral dermatitis, tear trough deformity, décolletage wrinkles (chest wrinkles), age spots, stretch marks, scarring, hair loss, psoriasis, eczema and/or dry skin. Further, conditions to be treated using methods provided herein could include pain and/or inflammation. The extent of penetration of the microstructures into the skin may be dependent on the skin condition. For example, coarse skin may require longer microstructures to break through the skin, whilst damaged skin may require penetration to a lesser depth to achieve the same effect.

It is envisaged that the present invention may also be applicable for veterinary applications. It is expected that in order for the transdermal patch to be effective, the animal skin may have to be shaved off to enable direct contact with the skin. The term 'animal' includes all vertebrate mammals, such as non-human primates, sheep, dogs, cats, horses, goats, cows, and chickens.

The present invention also provides a microstructure obtainable by any of the methods herein disclosed.

The invention will now be illustrated in the following examples with reference to the accompanying drawings.

Examples

The inventors of the present invention have surprisingly found that manufacturing microstructures with a microstructure composition which has a viscosity of at least 10,000 cps (at least 10 Pa·s), and varying the viscosity value above this value, results in a more time efficient and accurate process than microstructure compositions below this viscosity value. Additionally, microstructure compositions of above this viscosity have a reduced tendency to become aerated, do not result in the requirement of excess microstructure composition to be used, result in fewer printing passes to be used and is a more cost effective approach than microstructure compositions below this viscosity value. The ability to vary the viscosity of the microstructure composition (wherein the viscosity of the microstructure composition is at least 10,000 cps), used to create a single microstructure, enables different shaped microstructures to be created (FIG. 1), tailored to the purpose for which they are intended, for example, use on a transdermal patch.

Prior to the development of the present invention, the inventors initially attempted to manufacture microstructures using low viscosity microstructure compositions. The results of various tests are provided in the figures. After much testing and modification the inventors eventually arrived at the surprising conclusion that the viscosity is important and that only microstructure compositions having a viscosity of at least 10,000 cps (10 Pa·s) were able to produce microstructures having the desirable characteristics described above.

Figure 2:
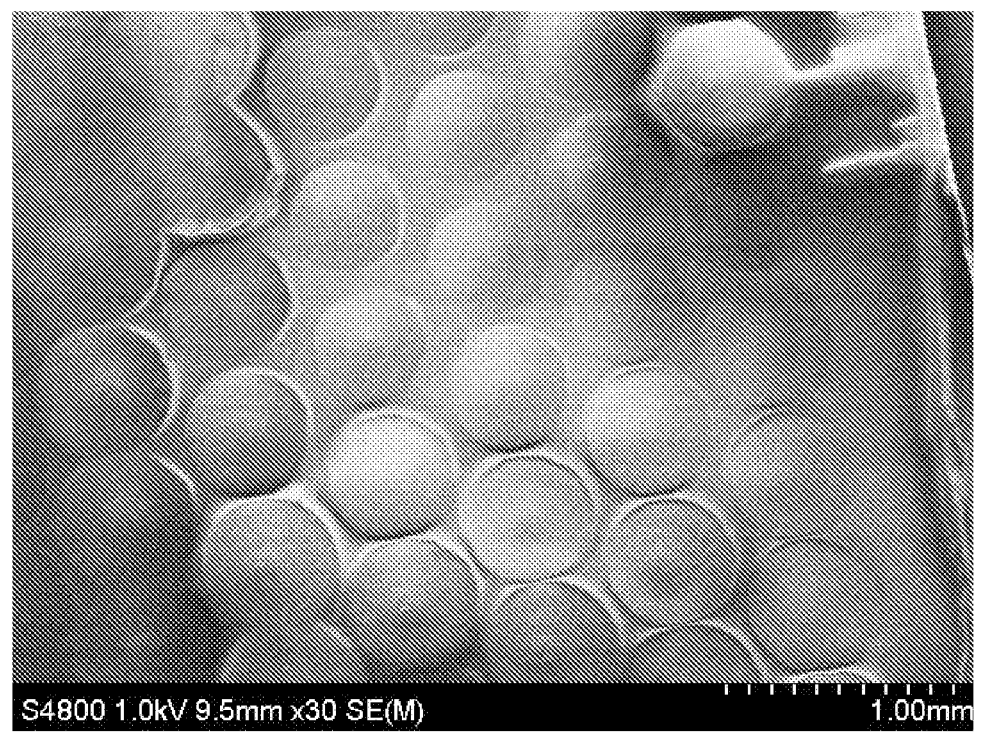
FIG. 2: An example micrograph displaying the deposition of a polymer having a viscosity of 90 cps and 200 cps (0.09 Pa·s and 0.2 Pa·s) on a flat smooth substrate, resulting in sub-optimal microstructures.
Figure 3:
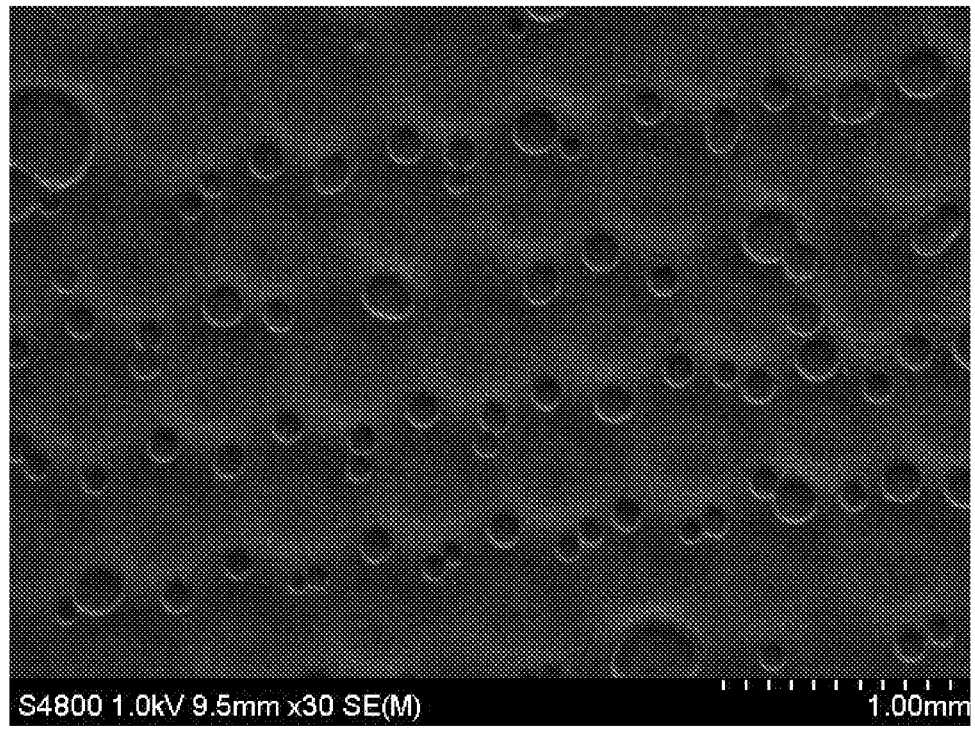
FIG. 3: An example micrograph displaying the aeration of the layering and imprecise build of the resulting microstructure when depositing a polymer having a viscosity of 90 cps and 200 cps (0.09 Pa·s and 0.2 Pa·s) on a flat smooth substrate, resulting in sub-optimal microstructures.
Figure 4:
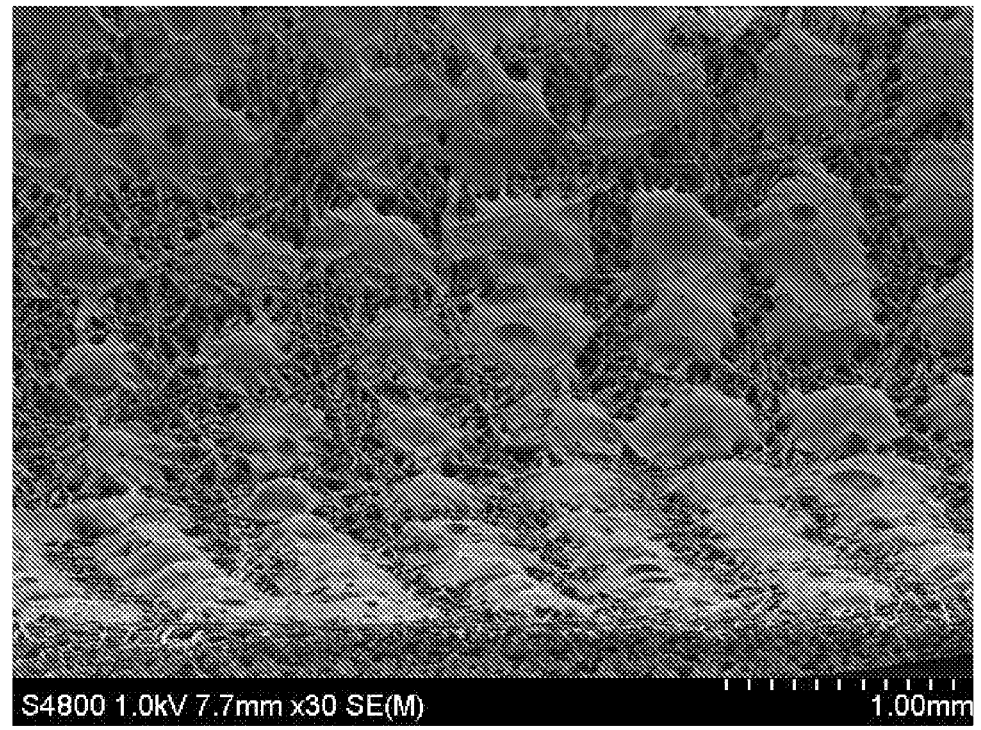
FIG. 4: An example micrograph displaying the deposition of a polymer having a viscosity of 90 cps and 200 cps (0.09 Pa·s and 0.2 Pa·s) on a rough substrate, resulting in sub-optimal microstructures.
Figure 5:
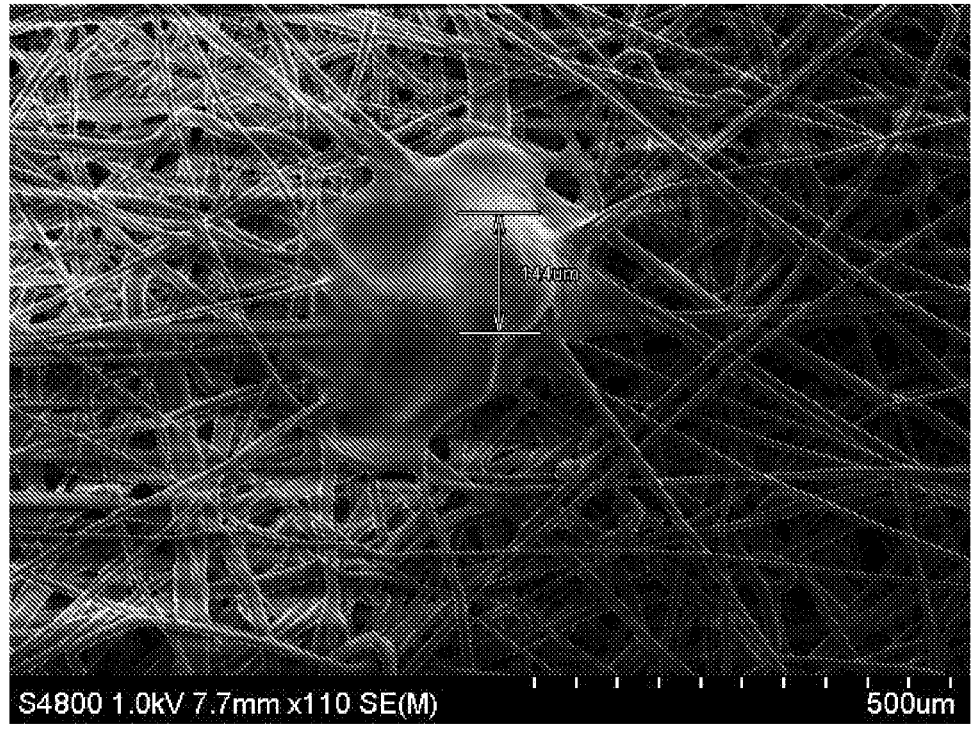
FIG. 5: An example micrograph displaying the deposition of a polymer having a viscosity of 90 cps and 200 cps (0.09 Pa·s and 0.2 Pa·s) on an absorbent substrate, resulting in sub-optimal microstructures.

In the first instance, a microstructure composition having a viscosity of 90 cps to 200 cps (0.09 Pa·s to 0.2 Pa·s) was deposited on a flat smooth substrate. However, at this level of viscosity, the composition failed to hold its shape and flowed in an uncontrollable manner across the surface of the substrate (FIG. 2). Additionally, not only was the building of the microstructure imprecise but unwanted aeration of the layering was observed (FIG. 3). Initially, the inventors sought to improve the results by varying the type of substrate used, whilst maintaining the microstructure composition stated above. The use of a rougher substrate or an absorbent substrate still failed to produce the desired microstructures (FIGS. 4 and 5).

Figure 6:
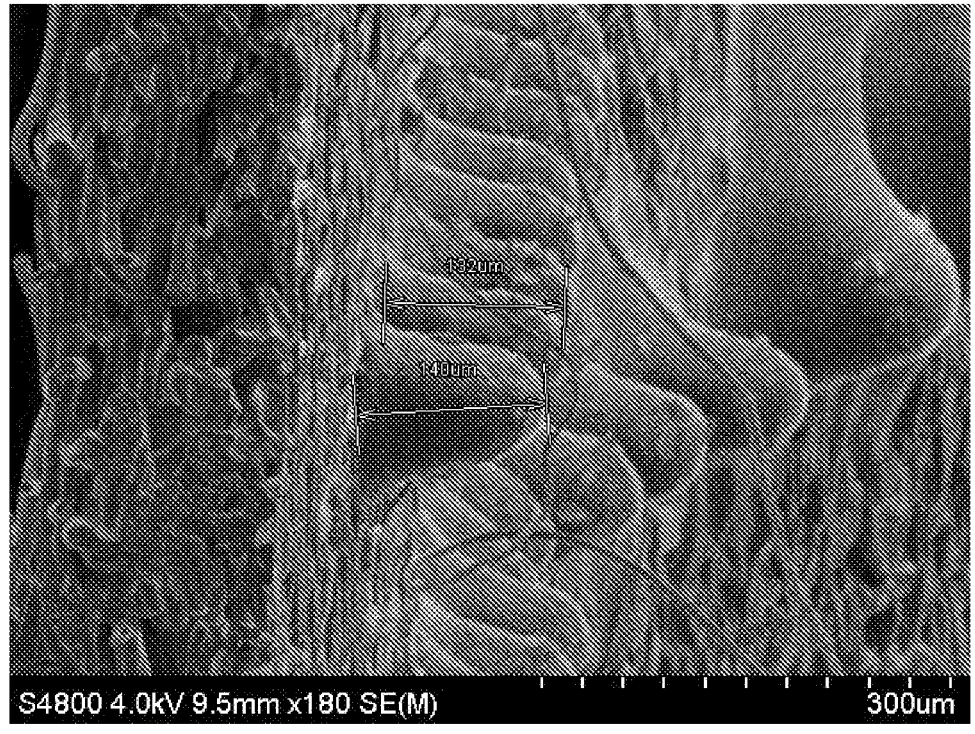
FIG. 6: An example micrograph displaying the deposition of a polymer having a viscosity of 1000 cps and 3000 cps (1 Pa·s and 3 Pa·s), resulting in sub-optimal microstructures.

The inventors then tried using a microstructure composition with a higher viscosity of 1000 cps to 3000 cps (1 Pa·s to 3 Pa·s). However, this approach resulted in excessive layers being needed (30+) in order to achieve the expected structure (FIG. 6), a limitation that is both inefficient in terms of time and resource.

Figure 7:
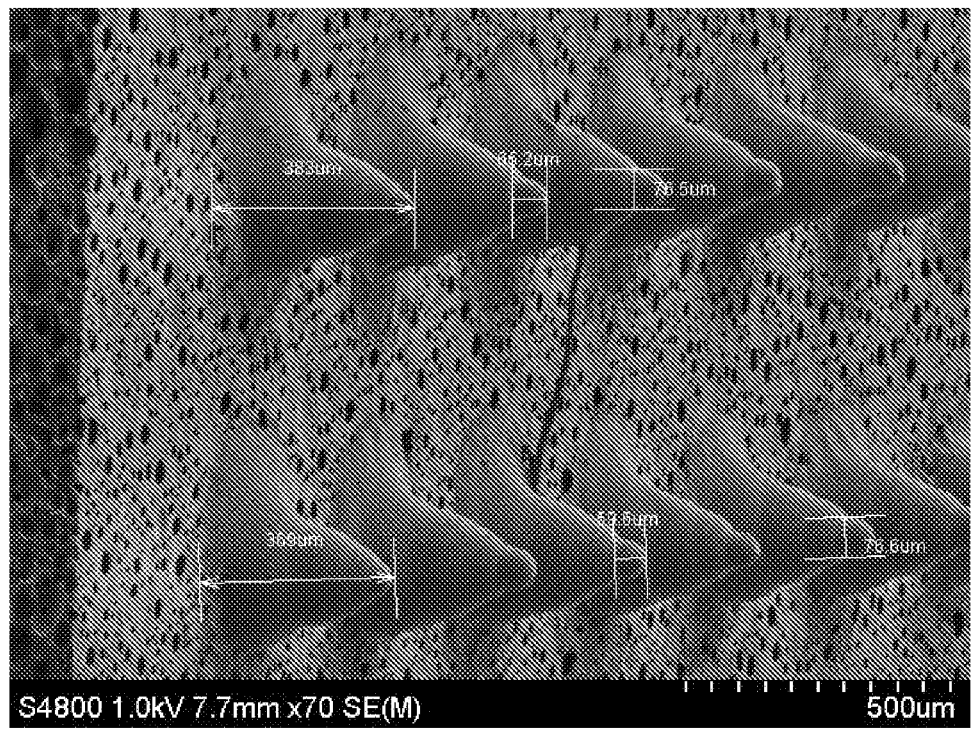
FIG. 7: An example micrograph displaying the deposition of a polymer having a viscosity of 10,000 cps (10 Pa·s).
Figure 8:
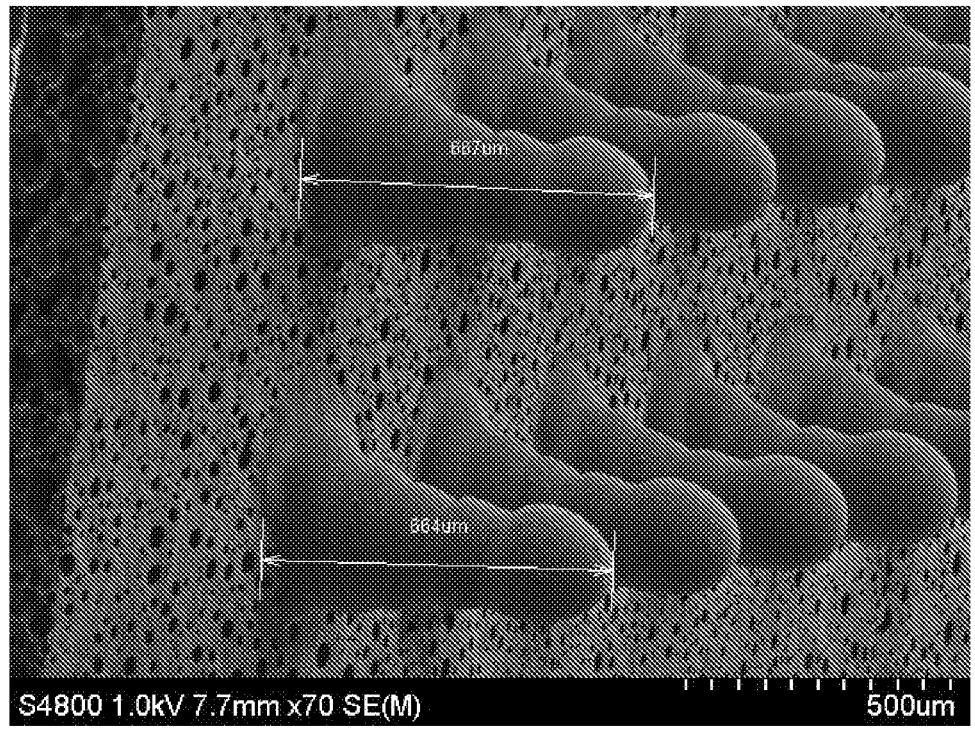
FIG. 8: An example micrograph displaying the results when using a polymer having a viscosity of 10,000 cps (10 Pa·s).
Figure 9:
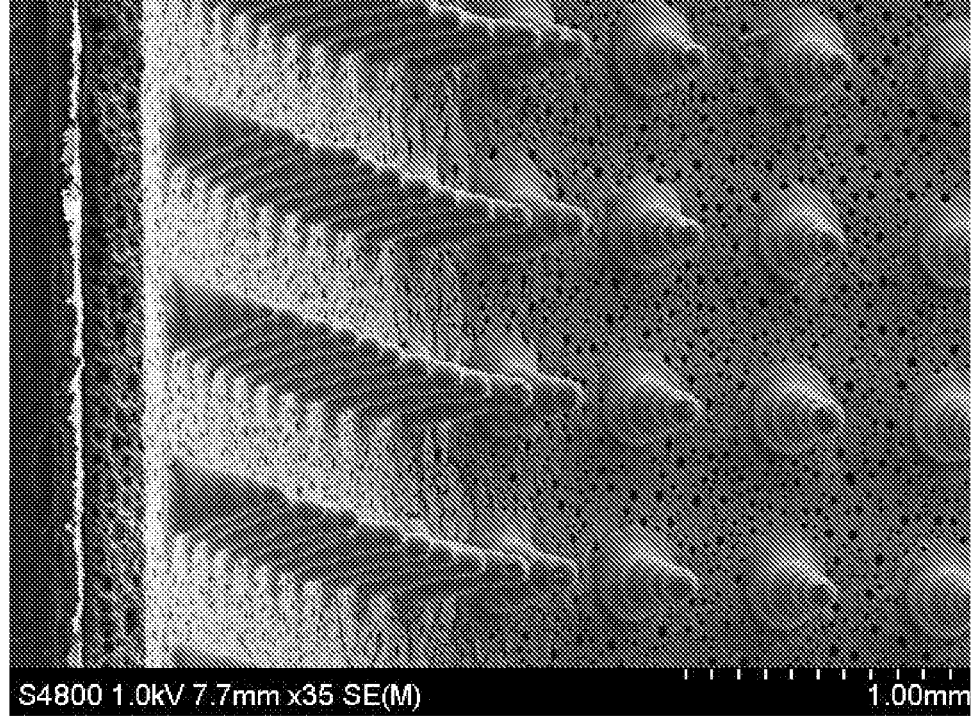
FIG. 9: An example micrograph displaying the deposition of a polymer having a viscosity of at least 10,000 cps (10 Pa·s) and the resulting microstructures having the desired characteristics.

Only when the microstructure composition had the higher viscosity value of 10,000 cps (10 Pa·s), were improvements seen in terms of improved form on release and reduced flow on the substrate (FIGS. 7 and 8). The inventors subsequently discovered a direct correlation between the ability of the microstructure composition to retain its shape, due to the higher viscosity used, and the yield per deposit, allowing a reduction in the number of layering steps required. This was particularly evident when the inventors progressed to using a microstructure composition having a viscosity of at least 10,000 cps (10 Pa·s), wherein the layers of deposition could be reduced to just 16, a stark contrast to the 30+ layers required at lower viscosities. Not only was there an improved deposition yield at the claimed viscosity, but an enhanced control of the process, reproducibility of the form and structure of the microstructures and a lack of undesirable aeration of the layering (FIG. 9). Accordingly, microstructure compositions having a viscosity of below 10,000 cps are unable to achieve the desired structure or reduction in the number of layers to enable a commercially viable process.

The invention claimed is:

1. A method for manufacturing a microstructure, the method comprising the step of:

applying a microstructure composition to a perforated template comprising through-holes, wherein the microstructure composition passes through a through-hole and is deposited on a substrate; and repeating application of the microneedle composition one or more times, thereby forming a microstructure, characterised in that the microstructure composition has a viscosity of between 210,000 cps to 250,000 cps, and wherein the microstructure composition is self-adherent.

2. The method of claim 1, further comprising the step of exposing the microstructure composition deposited on the substrate to a curing agent, preferably wherein the curing agent is ultraviolet light.

3. The method of claim 1, wherein the perforated template is moved away from the substrate and re-positioned and aligned, such that the through hole aligns with the microstructure, between each application of the microstructure composition.

4. The method of claim 3, wherein the template is re-positioned using an alignment system of positional markings incorporated on a surface of the perforated template, and corresponding markers incorporated on the substrate onto which the microstructure composition is deposited.

5. The method of claim 1, wherein the microstructure composition comprises a polymer.

6. The method of claim 5, wherein the polymer comprises a UV-curable polymer.

7. The method of claim 1, wherein the microstructure is substantially circular, square, rectangular, hexagonal, triangular or of a kidney bean shape.

8. The method of claim 1, wherein the microstructure is one of an array of microstructures.

9. The method of claim 1, wherein the microstructure is a microneedle.

10. The method of claim 1, wherein the substrate is a PVC, a metal, a poly-lactic acid, a glass, a ceramic, a polystyrene, a cellulose based substrate, a poly-vinyl alcohol, a polycarbonate, a poly-methyl methacrylate, a silicone, a poly-ethylene terephthalate, a polyurethane or a nitrocellulose.

11. The method of claim 1, wherein the substrate forms at least a part of a transdermal patch.

12. The method of claim 1, wherein the microstructure composition further comprises an active ingredient, an electrically conductive material and/or a bio-chemical reagent.

13. The method of claim 1, wherein the method comprises a further step of applying a coating composition to the microstructure, wherein the coating composition comprises an active ingredient, an electrically conductive material and/or a bio-chemical reagent.

14. The microstructure composition of claim 6, wherein the UV-curable polymer comprises acrylate and/or methacrylate.

\* \* \* \* \*